(12) United States Patent
Claessens et al.

(10) Patent No.: US 8,508,716 B2
(45) Date of Patent: Aug. 13, 2013

(54) HOMOGENIZER

(75) Inventors: Bert Jan Claessens, Spalbeek (BE); Marcel Mathijs Theodore Marie Dierichs, Venlo (NL); Herman Philip Godfried, Amsterdam (NL)

(73) Assignee: ASML Netherlands B.V., Veldhoven (NL)

( * ) Notice: Subject to any disclaimer, the term of this patent is extended or adjusted under 35 U.S.C. 154(b) by 309 days.

(21) Appl. No.: 12/908,980

(22) Filed: Oct. 21, 2010

(65) Prior Publication Data

US 2011/0122385 A1 May 26, 2011

Related U.S. Application Data

(60) Provisional application No. 61/262,987, filed on Nov. 20, 2009.

(51) Int. Cl.
*G03B 27/54* (2006.01)
(52) U.S. Cl.
USPC .......................................................... 355/67
(58) Field of Classification Search
USPC ....................... 355/67, 55; 359/622; 356/121
See application file for complete search history.

(56) References Cited

U.S. PATENT DOCUMENTS

| | | | |
|---|---|---|---|
| 2008/0013182 A1* | 1/2008 | Ferber | 359/619 |
| 2008/0151206 A1* | 6/2008 | Baselmans et al. | 355/53 |
| 2009/0026388 A1* | 1/2009 | Drozdowicz | 250/492.2 |
| 2009/0068802 A1* | 3/2009 | Moriwaka | 438/166 |
| 2009/0091734 A1* | 4/2009 | Visser et al. | 355/67 |
| 2009/0097007 A1* | 4/2009 | Tanaka | 355/67 |
| 2009/0231718 A1* | 9/2009 | Muenz et al. | 359/626 |
| 2010/0266268 A1* | 10/2010 | Jennings et al. | 392/407 |

FOREIGN PATENT DOCUMENTS

| | | |
|---|---|---|
| JP | 02-254710 A | 10/1990 |
| JP | 2001-210586 A | 8/2001 |
| JP | 2004-266259 A | 9/2004 |
| JP | 2005-079449 A | 3/2005 |
| JP | 2009-236819 A | 10/2009 |
| WO | WO 2009/080279 A1 | 7/2009 |

* cited by examiner

*Primary Examiner* — Peter B Kim
*Assistant Examiner* — Deoram Persaud
(74) *Attorney, Agent, or Firm* — Sterne, Kessler, Goldstein & Fox P.L.L.C.

(57) ABSTRACT

A two-stage homogenizer comprising a first homogenizer stage and a second homogenizer stage. The first homogenizer stage includes a pair of microlens arrays and associated focusing optics. The second homogenizer stage includes a second pair of microlens arrays and associated focusing optics. The second homogenizer stage is positioned to receive radiation which is output from the first homogenizer stage.

11 Claims, 4 Drawing Sheets

HOMOGENIZER

CROSS REFERENCE TO RELATED APPLICATIONS

This application claims priority under 35 U.S.C. §119(e) to U.S. Provisional Patent Application 61/262,987, filed Nov. 20, 2009, which is incorporated by reference herein in its entirety.

BACKGROUND

1. Field of the Invention

The present invention relates to a homogenizer. The homogenizer may form part of an illumination system of a lithographic apparatus. The present invention also relates to a beam delivery system suitable for delivering radiation from a radiation source to a lithographic apparatus.

2. Background Art

A lithographic apparatus is a machine that applies a desired pattern onto a target portion of a substrate. Lithographic apparatus can be used, for example, in the manufacture of integrated circuits (ICs). In that circumstance, a patterning device, which is alternatively referred to as a mask or a reticle, may be used to generate a circuit pattern corresponding to an individual layer of the IC, and this pattern can be imaged onto a target portion (e.g., comprising part of, one or several dies) on a substrate (e.g., a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the beam in a given direction (the "scanning"-direction) while synchronously scanning the substrate parallel or anti parallel to this direction.

Conventional lithographic apparatus include an illumination system which may be used to modify properties of a radiation beam before the radiation beam is incident upon the patterning device. The illumination system may for example be used to adjust the outer radial extent of the radiation beam in a pupil plane, and/or in the case of an annular illumination mode to modify the inner radial extent of the radiation beam in a pupil plane. In some lithographic apparatus it is possible to switch between different forms of illumination mode such as annular, disc shaped, dipole and quadrupole. This may be achieved by moving different optical elements into and out of the radiation beam, each optical element applying a different illumination mode to the radiation beam. Recently, it has been proposed that a lithographic apparatus may use an array of individually controllable mirrors to obtain different illumination modes. Using an array of minors in this way has the advantage that illumination modes having a wide variety of different shapes may be formed.

Where an array of individually controllable mirrors is used to obtain the illumination mode, homogenizing optics may be used to homogenize the radiation beam before it is incident upon the array of individually controllable mirrors. A problem associated with the use of a homogenizer in this way is that the peak intensity of the radiation beam in some parts of the homogenizer may be so high that those parts of the homogenizer are damaged.

SUMMARY

It is desirable to provide, for example a homogenizer which obviates or mitigates the issues discussed identified herein or elsewhere.

According to a first aspect of the present invention, there is provided a two-stage homogenizer comprising a first homogenizer stage and a second homogenizer stage. The first homogenizer stage comprising a pair of microlens arrays and associated focusing optics. The second homogenizer stage comprising a second pair of microlens arrays and associated focusing optics. The second homogenizer stage is positioned to receive radiation which is output from the first homogenizer stage.

According to a second aspect of the present invention, there is provided a method of homogenizing a radiation beam comprising passing the radiation beam through a first pair of microlens arrays, passing the radiation beam through focusing optics, passing the radiation beam through a second pair of microlens arrays, then passing the radiation beam through additional focusing optics.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

Figure 1:
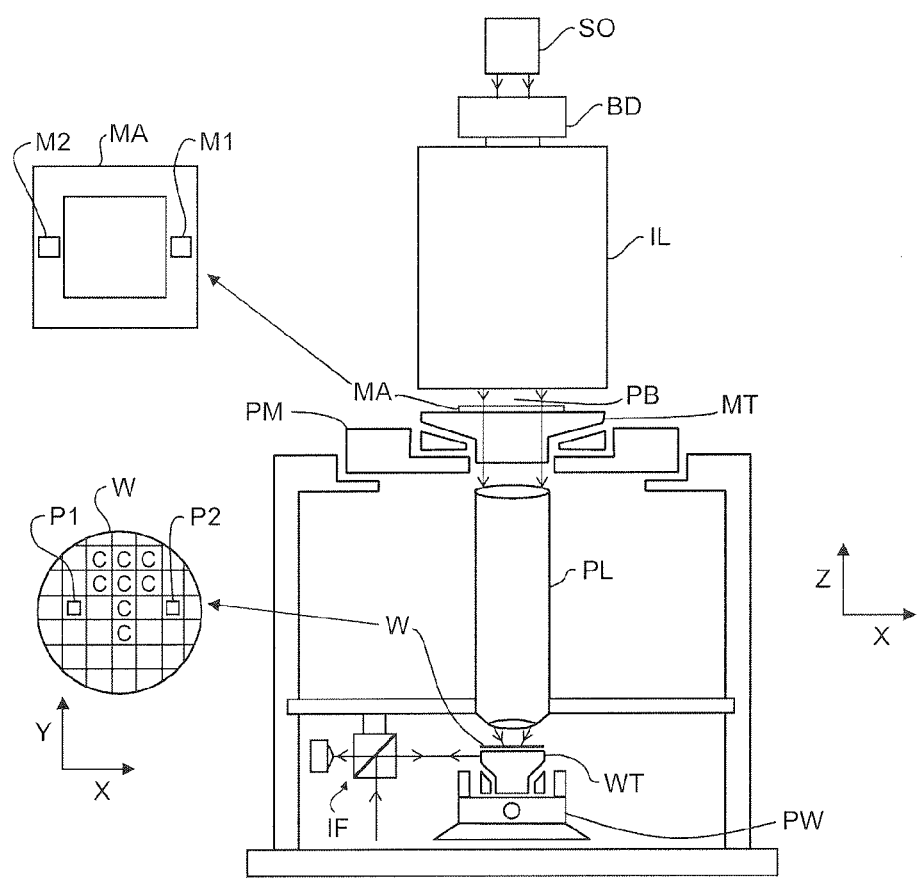
FIG. 1 depicts a lithographic apparatus according to an embodiment of the invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the invention. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a foam readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, however, it is instructive to present an example environment in which embodiments of the present invention may be implemented.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of 365, 248, 193, 157 or 126 nm) and extreme ultra-violet (EUV) radiation (e.g., having a wavelength in the range of 5-20 nm), as well as particle beams, such as ion beams or electron beams.

The term "patterning device" used herein should be broadly interpreted as referring to a device that can be used to impart a radiation beam with a pattern in its cross-section such as to create a pattern in a target portion of the substrate. It should be noted that the pattern imparted to the radiation beam may not exactly correspond to the desired pattern in the target portion of the substrate. Generally, the pattern imparted to the radiation beam will correspond to a particular functional layer in a device being created in the target portion, such as an integrated circuit.

A patterning device may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure holds the patterning device. It holds the patterning device in a way depending on the orientation of the patterning device, the design of the lithographic apparatus, and other conditions, such as for example whether or not the patterning device is held in a vacuum environment. The support can use mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "projection lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having two (dual stage) or more substrate tables (and/or two or more support structures). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g., water, so as to fill a space between the final element of the projection system and the substrate. Immersion techniques are well known in the art for increasing the numerical aperture of projection systems.

FIG. 1 schematically depicts a lithographic apparatus according to a particular embodiment of the invention. The apparatus comprises an illumination system IL to condition a beam PB of radiation (e.g., UV radiation or EUV radiation), a support structure (e.g., a support structure) MT to support a patterning device (e.g., a mask) MA and connected to first positioning device PM to accurately position the patterning device with respect to item PL, a substrate table (e.g., a wafer table) WT for holding a substrate (e.g., a resist coated wafer) W and connected to second positioning device PW for accurately positioning the substrate with respect to item PL, and a projection system (e.g., a refractive projection lens) PL configured to image a pattern imparted to the radiation beam PB by patterning device MA onto a target portion C (e.g., comprising one or more dies) of the substrate W.

As here depicted, the apparatus is of a transmissive type (e.g., employing a transmissive mask). Alternatively, the apparatus may be of a reflective type (e.g., employing a programmable mirror array of a type as referred to above).

The illumination system IL receives a beam of radiation from a radiation source SO. The source and the lithographic apparatus may be separate entities, for example when the source is an excimer laser. In such cases, the source is not considered to form part of the lithographic apparatus and the radiation beam is passed from the source SO to the illumination system IL with the aid of a beam delivery system BD comprising for example suitable directing mirrors and/or a beam expander. In other cases the source may be integral part of the apparatus, for example when the source is a mercury lamp. The source SO and the illumination system IL, together with the beam delivery system BD if required, may be referred to as a radiation system.

The illumination system IL may comprise an array of individually controllable mirrors which may be used to select a desired illumination mode. The illumination system IL may also comprise various other components, such as an integrator and a condenser. The illumination system provides a conditioned beam of radiation PB, having a desired uniformity and intensity distribution in its cross section.

The radiation beam PB is incident on the patterning device (e.g., mask) MA, which is held on the support structure MT. Having traversed the patterning device MA, the beam PB passes through the lens PL, which focuses the beam onto a target portion C of the substrate W. With the aid of the second positioning device PW and position sensor IF (e.g., an interferometric device), the substrate table WT can be moved accurately, e.g., so as to position different target portions C in the path of the beam. PB. Similarly, the first positioning device PM and another position sensor (which is not explicitly depicted in FIG. 1) can be used to accurately position the patterning device MA with respect to the path of the beam PB, e.g., after mechanical retrieval from a mask library, or during a scan. In general, movement of the object tables MT and WT will be realized with the aid of a long-stroke module (coarse positioning) and a short-stroke module (fine positioning), which form part of the positioning device PM and PW. However, in the case of a stepper (as opposed to a scanner) the support structure MT may be connected to a short stroke actuator only, or may be fixed. Patterning device MA and substrate W may be aligned using patterning device alignment marks M1, M2 and substrate alignment marks P1, P2.

The depicted apparatus can be used in the following preferred modes:

1. In step mode, the support structure MT and the substrate table WT are kept essentially stationary, while an entire pattern imparted to the beam PB is projected onto a target portion C in one go (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the beam PB is projected onto a target portion C (i.e., a single dynamic exposure). The velocity and direction of the substrate table WT relative to the support structure MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the beam PB is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
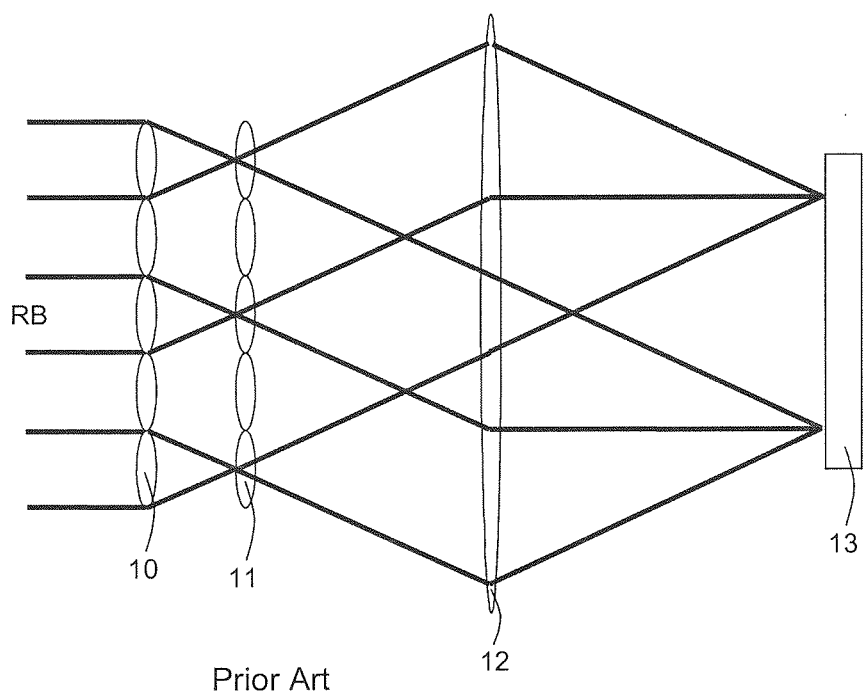
FIG. 2 depicts a homogenizer.

FIG. 2 shows schematically a homogenizer forming part of an illumination system of an lithographic apparatus. The homogenizer comprises a first microlens array 10, a second microlens array 11, and a condensing lens 12. A radiation beam RB is incident upon the first microlens 10, which focuses the radiation beam to a plurality of focal points. The plurality of focal points lie close to the plane of the second microlens array 11. The radiation beam RB passes through the second microlens array 11 and is then incident upon the condensing lens 12. The condensing lens 12 focuses the radiation beam RB and directs the radiation beam towards an array of individually controllable mirrors 13 (referred to hereafter as mirror array 13). In some instances, an additional microlens array (not shown) may be located between the second microlens array and the array of individually controllable mirrors. The homogenizer separates the radiation beam RB into parts, expands each part and overlaps each part at the mirror array 13. In this way, intensity variation across the radiation beam is averaged out (the radiation beam is homogenized).

A problem which may arise in the homogenizer is that the peak intensity of the radiation in the second microlens array 11 may be so high that the second microlens array is damaged. The high peak intensity arises as a consequence of low divergence of the radiation beam RB which is incident upon the first microlens array 10 (the radiation beam in an illumination system of a lithographic apparatus typically has a low divergence). The lower the divergence, the tighter the focusing provided by the first microlens array 10, and the higher the peak intensity of radiation in the second microlens array 11.

Figure 3:
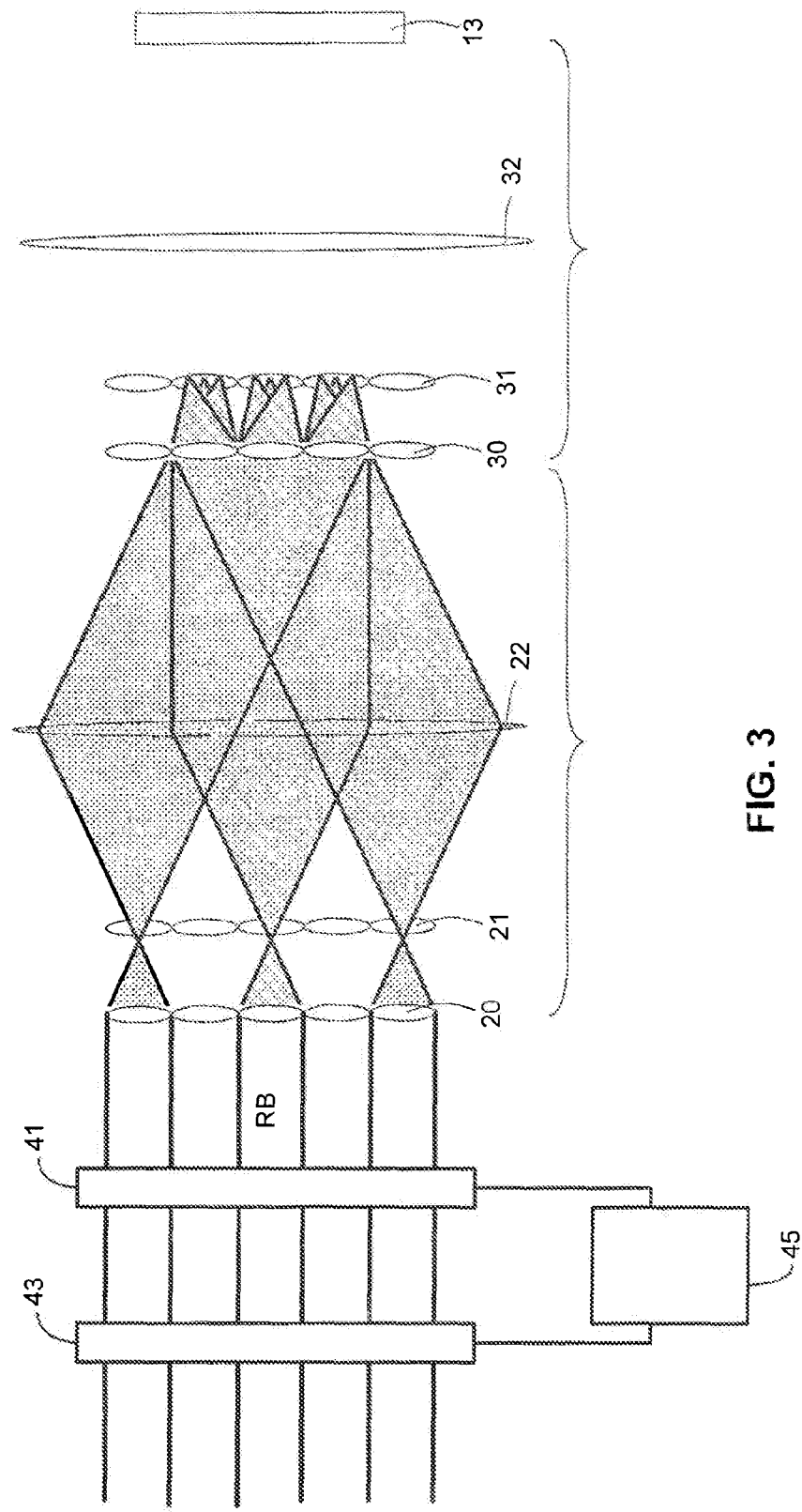
FIG. 3 depicts a homogenizer according to an embodiment of the invention.

FIG. 3 shows a homogenizer according to an embodiment of the present invention. The homogenizer comprises a combination of a first homogenizer stage 1 and a second homogenizer stage 2, the second homogenizer stage being positioned to receive radiation which has been output by the first homogenizer stage. The second homogenizer stage 2 outputs radiation to the mirror array 13. In some instances an additional microlens array (not shown) may be located between the second microlens array and the array of individually controllable mirrors.

Since the homogenizer comprises a first homogenizer stage 1 and a second homogenizer stage 2, it will be referred to hereafter as a two-stage homogenizer. This is not intended to preclude the possibility that the homogenizer is provided with a third homogenizer stage (or further additional homogenizer stages).

The first homogenizer stage 1 conditions the radiation beam RB such that it generates lower peak radiation intensities in the second homogenizer stage 2 than would be the case if the first homogenizer stage was not present.

The first homogenizer stage 1 has a similar configuration to the homogenizer in FIG. 2, and comprises a first microlens array 20, a second microlens array 21 and a condensing lens 22. As can be seen from FIG. 3, the first homogenizer stage 1 spreads out the focused radiation beam in a second microlens array 31 of the second homogenizer stage. This occurs because a first microlens array 30 of the second homogenizer stage 2 receives radiation over a wide variety of incident angles. It is this wide variety of incident angles which provides a spread of focal points of the radiation beam at the second microlens array 31, thereby spreading out the focused radiation beam. Since the focused radiation beam is spread out in the second microlens array 31, the peak intensity of the radiation in the second microlens array is reduced. This reduces the likelihood that the second microlens array 31 will be damaged by the radiation. The second microlens array 31 of the second homogenizer stage 2 may be positioned such that it does not lie in the focal plane of the first microlens array 30 of the second homogenizer stage.

In addition to reducing the peak intensity of the radiation in the second microlens array 31, the two-stage homogenizer also reduces fluctuations of the peak intensity of the radiation in the second microlens array. The range of incident angles of the radiation beam at the first microlens array 30 of the second homogenizer stage 2 determines the spread of focal points of the radiation beam at the second microlens array 31, and thereby determines the peak intensity of the radiation. This range of incident angles depends upon the diameter of the radiation beam RB at the first microlens array 20 of the first homogenizer stage 1. In a typical lithographic apparatus, the diameter of the radiation beam RB will vary by around 5% (e.g., a 1 mm variation on a 20 mm diameter radiation beam). Thus, the range of incident angles at the first microlens array 30 of the second homogenizer stage 2 will typically also vary by around 5%. Consequently, the separation of the focal points will vary by around 5%. If the second microlens array 31 is positioned such that it does not lie in the focal plane of the first microlens array 30, then the variation of peak intensity may be less than 5% in this example.

The diameter of the radiation beam RB may vary by other amounts in other lithographic apparatus. However, the diameter of the radiation beam is a relatively well controlled parameter, and is relatively easy to measure. According to one embodiment, a detector, e.g., detector 41 of FIG. 3, may be used to detect the diameter of the radiation beam. A processor, e.g., processor 45 of FIG. 3, may be used to determine the peak intensity of the radiation beam in the second microlens array of the second homogenizer stage based upon the detected diameter of the radiation beam. This may be done for example via a previously measured relationship between the diameter of the radiation beam and the peak intensity of the radiation beam in the second microlens array of the second homogenizer stage. Thus, the peak intensity of the radiation in the second microlens array 31 may be relatively easily monitored.

In one embodiment, the homogenizer may be provided with adjusting optics, e.g., adjusting optics 43 of FIG. 3, which are configured to provide adjustment of the diameter of the radiation beam. The adjusting optics may for example adjust the diameter of the radiation beam in response to a detected diameter of the radiation beam. For example, if the processor determines that the peak intensity of the radiation beam in the second microlens array of the second homogenizer stage is too high, then adjusting optics may be used to increase the diameter of the radiation beam, thereby reducing the peak intensity.

In contrast to the above, the peak intensity of the radiation in the second microlens array 11 of the homogenizer of FIG. 2 depends upon the divergence of the radiation beam RB. The divergence of a radiation beam in a lithographic apparatus may typically vary by 50% or more. Thus, the peak intensity of the radiation in the second microlens array 11 may also vary by a similar amount. Consequently, damage of the second microlens array 11 in the homogenizer is more likely to occur.

In addition, divergence is a relatively difficult property to measure. Thus, it is difficult to determine the peak intensity of the radiation in the second microlens array 11 by monitoring the divergence of the radiation beam RB.

It might be assumed that the first homogenizer stage 1 will suffer from the same problems that were described above in relation to the homogenizer of FIG. 2. However, is not the case. The second microlens array 11 of the FIG. 2 homogenizer is the subject of design constraints, since it is required to form a homogenized radiation beam at the mirror array 13. However, the second microlens array 21 of first homogenizer stage 1 is not subject to the same design constraints. For example, the second microlens array 21 of the first homogenizer stage 1 may be provided further from the focal plane of the first microlens array 20 than the second microlens array 11 of the FIG. 2 homogenizer (as is shown in FIG. 3). Where this is done, the radiation beam has diverged more before it enters the second microlens array 21, and thus has a lower peak intensity. Another way in which the peak intensity of radiation in the second microlens array 21 may be reduced is by using a one dimensional array as the second microlens array rather than a two dimensional array.

The first and second microlens arrays 10, 11 of the homogenizer are two dimensional arrays, and the mirror array 13 is also a two dimensional array. Similarly, the first and second microlens arrays 30, 31 of the second homogenizer stage 2 of the two-stage homogenizer may also be two dimensional arrays. The first and second microlens arrays 20, 21 of the first homogenizer stage 1 may be two dimensional arrays or may be one dimensional arrays. Where one dimensional arrays are used, each microlens of the first and second microlens arrays 20, 21 may comprise a cylindrical lens which provides focusing in one plane, but does not provide focusing in the other plane. Where one dimensional arrays are used, because focusing of the radiation beam RB occurs in only one plane, the focused radiation beam is a strip of light rather than a point of light. The strip of light has a larger surface area than a point of light, and therefore has a lower peak intensity. This reduces the likelihood that the second microlens array 21 is damaged by the radiation beam.

In a typical lithographic apparatus, the radiation beam RB has low divergence in one plane, and has higher divergence in the opposite plane. The two-stage homogenizer may be arranged such that the first homogenizer stage 1 homogenizes the radiation beam PB in the low divergence plane, but does not homogenize the radiation beam in the high divergence plane. It is the low divergence plane which will give rise to high peak intensities in the second microlens 31 of the second homogenizer stage (for the reasons explained further above). Thus, homogenization of the radiation by the first homogenizer stage 1 in the low divergence plane is beneficial. The high divergence plane will not give rise to high peak intensities in the second microlens 31 of the second homogenizer stage. Thus, homogenization of the radiation by the first homogenizer stage 1 in the high divergence plane is not required. When one dimensional arrays are used in the first homogenizer stage, the microlenses of the first and second microlens arrays 20, 21 may be configured to provide focusing in the low divergence plane of the radiation beam.

The condensing lens 22 of the first homogenizer stage 1 may be considered to be an example of focusing optics. The focusing optics may include a plurality of lenses (one or more of which may be a condensing lens). Similarly, the condensing lens 32 of the second homogenizer stage 2 may also be considered to be an example of focusing optics. Again, the focusing optics may include a plurality of lenses (one or more of which may be a condensing lens).

Embodiments of the invention may be considered to fragment the radiation beam RB in pointing space. As a consequence of the fragmentation of the radiation beam in pointing space, the angular distribution of radiation entering the second microlens array 31 of the second homogenizer stage 2 may be adjusted by modifying the diameter of the radiation beam.

The mirror array 13 is an example of an array of individually controllable elements. Arrays of other individually controllable elements may be used, such as individually controllable diffraction gratings.

Figure 4:
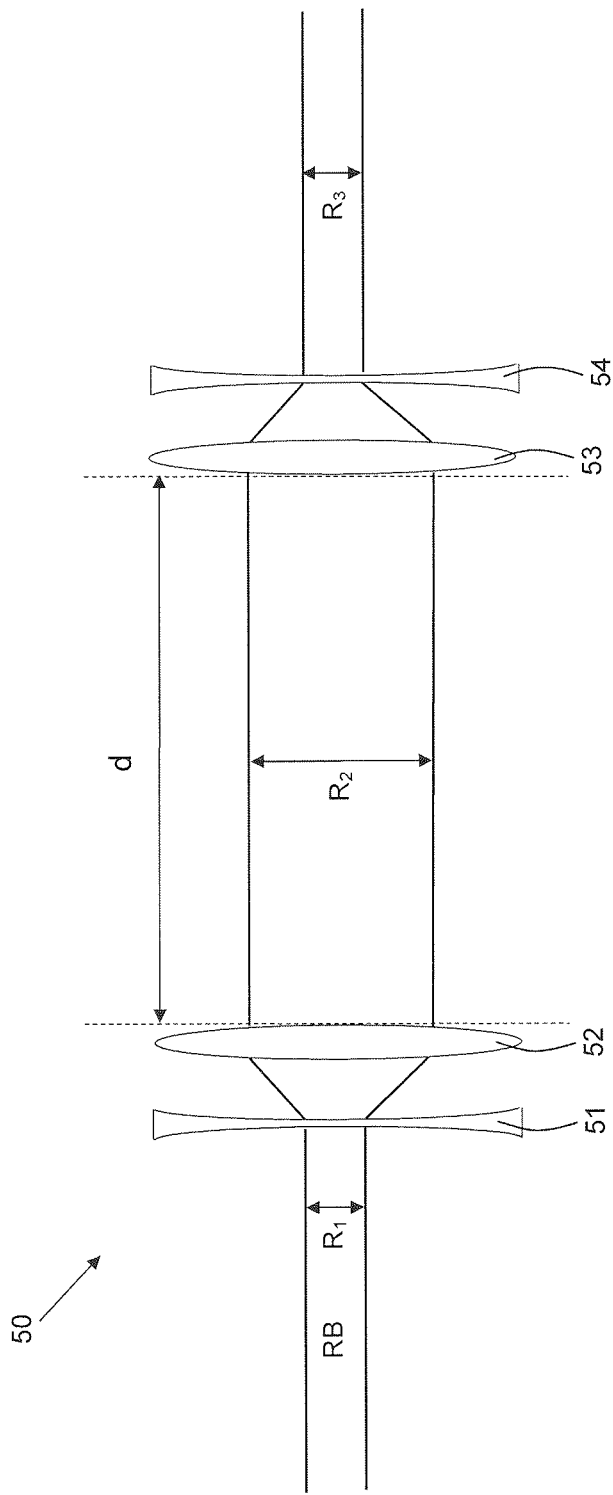
FIG. 4 depicts a beam delivery system according to an alternative embodiment of the invention.

FIG. 4 shows schematically an alternative embodiment of the invention. A beam delivery apparatus 50 comprises a first concave lens 51 and a first convex lens 52, together with a second convex lens 53 and a second concave lens 54. The first concave lens 51 and first convex lens 52 are arranged such that they form a telescope which increases the diameter of a radiation beam RB. The second convex lens 53 and second concave lens 54 are configured to form an inverse telescope which reduces the diameter of the radiation beam RB. The powers of the telescope and the inverse telescope are the same. Consequently, the diameter R3 of the radiation beam RB after it has passed through the beam delivery apparatus 50 is the same as the diameter R1 of the radiation beam on entering the beam delivery apparatus.

The beam delivery apparatus 50 may for example receive the radiation beam RB from a radiation source (not shown). The beam delivery apparatus 50 may for example deliver the radiation beam to an illumination system IL of a lithographic apparatus (see FIG. 1).

The beam delivery apparatus 50 may be used to conserve optical properties of the radiation beam RB in situations in which the illumination system of the lithographic apparatus is a considerable distance from the radiation source.

The illumination system may be designed to receive a radiation beam which has a particular diameter. Thus, optics at the radiation source (for example optics of a beam shaping apparatus of the radiation source) may be used to apply a divergence to the radiation beam such that it has the appropriate diameter when it reaches the illumination system. The divergence which is applied to the radiation beam will depend upon the distance between the radiation source and the illumination system. If the distance is small, then the divergence will be large, since the distance over which the radiation beam may diverge is small. Conversely, if the distance is large, then the divergence will be small, since the distance over which the radiation beam may diverge is large. When the distance is large, the divergence may need to be selected with a higher accuracy than when the distance is small. This may mean that after maintenance of the radiation source, optics of the radiation source must be adjusted in order to ensure that the appropriate divergence is applied to the radiation beam.

The above disadvantage is avoided by the beam delivery apparatus 50 of FIG. 4. The beam delivery apparatus 50 expands the diameter of the radiation beam RB and then contracts it again. The effective divergence of a radiation beam reduces as the diameter of the radiation beam increases. Thus, by increasing the diameter of the radiation beam RB using the first concave lens 51 and first convex lens 52, the effective divergence of the radiation beam is reduced. The increased diameter R2 of the radiation beam may be such that divergence of the radiation beam is negligible.

From the point of view of divergence of the radiation beam RB, the beam delivery apparatus 50 may be considered to effectively reduce the distance between the radiation source and the illumination system. Thus, selection of an appropriate divergence for the radiation beam RB in order to achieve a desired beam diameter at the entrance of the illumination system is made easier.

In one example, if the distance between the source and the illumination system is less than 7 meters, then the beam delivery apparatus of FIG. 4 is not used. If the distance is between 7 and 12 meters, then the beam delivery apparatus 50 is used. The optical powers of the lenses 51-54 are selected such that the divergence of the radiation beam as seen at the illumination system is equivalent to that which would be seen for a source to illumination system distance of between 3 and 7 meters. If the distance between the source and the illumination system is greater than 12 meters, then the beam delivery apparatus 50 is used, but with more powerful lenses 51-54. Again, the effect of the lenses is such that the divergence of the radiation beam at the illumination system is equivalent to that which would be seen for a source to illumination system distance of between 3 and 7 meters.

The power of the lenses used in the beam delivery apparatus 50 may be determined using the following matrices:

$$\begin{pmatrix} M & 0 \\ 0 & 1/M \end{pmatrix} \begin{pmatrix} 1 & d \\ 0 & 1 \end{pmatrix} \begin{pmatrix} 1/M & 0 \\ 0 & M \end{pmatrix} =$$
$$\begin{pmatrix} M & 0 \\ 0 & 1/M \end{pmatrix} \begin{pmatrix} 1/M & Md \\ 0 & M \end{pmatrix} = \begin{pmatrix} 1 & M^2 d \\ 0 & 1 \end{pmatrix}$$

where M is the magnification of the telescope provided by the lenses 51,52 (and of the inverse telescope provided by the lenses 53, 54), and d is the distance between the innermost pair of lenses 52, 53. In the above-mentioned example, the power of the telescope for a distance d of 7-12 meters is M=1.3. The power of the telescope for a distance d of 12-20 meters is M=1.8. It is noted that M<1 in the case that the reference distance is longer than the beam delivery distance. In that case the order of the telescope is inverted wherein a demagnifying telescope is followed by a magnifying one. This may be advantageous when the radiation source (for example a laser) has an inhomogeneous beam cross section with one or more high-intensity hot spots. Letting the beam propagate will tend to homogenize the beam by its own divergence.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A two-stage homogenizer comprising:
a first homogenizer stage comprising a first pair of microlens arrays and associated focusing optics;
a second homogenizer stage comprising a second pair of microlens arrays and associated focusing optics, the second homogenizer stage being positioned to receive radiation that is output from the first homogenizer stage, wherein the first and second pairs of microlens arrays are two-dimensional microlens arrays;
a detector configured to detect a diameter of a radiation beam incident upon the first homogenizer stage; and
a processor configured to determine a peak intensity of the radiation beam in a second microlens array of the second pair of microlens arrays based upon the detected diameter of the radiation beam.

2. The two-stage homogenizer of claim 1, wherein a second microlens array of the first pair of microlens arrays does not lie in a focal plane of a first microlens array of the first pair of microlens arrays.

3. The two-stage homogenizer of claim 1, wherein each of the focusing optics of the first and second homogenizer stages comprises one or more condensing lenses.

4. The two-stage homogenizer of claim 1, further comprising adjusting optics configured to provide adjustment of the diameter of the radiation beam in response to a detected diameter of the radiation beam.

5. An illumination system comprising:
a first homogenizer stage comprising a first pair of microlens arrays and associated focusing optics;
a second homogenizer stage comprising a second pair of microlens arrays and associated focusing optics, the second homogenizer stage being positioned to receive radiation that is output from the first homogenizer stage, wherein the first and second pairs of microlens arrays are two-dimensional microlens arrays;
an array of individually controllable elements configured to receive radiation output from the second homogenizer stage;
a detector configured to detect a diameter of a radiation beam incident upon the first homogenizer stage; and
a processor configured to determine a peak intensity of the radiation beam in a second microlens array of the second pair of microlens array based upon the detected diameter of the radiation beam.

6. A lithographic apparatus comprising:
a first homogenizer stage comprising a first pair of microlens arrays and associated focusing optics;
a second homogenizer stage comprising a second pair of microlens arrays and associated focusing optics, the second homogenizer stage being positioned to receive radiation that is output from the first homogenizer stage, wherein the first and second pairs of microlens arrays are two-dimensional microlens arrays;
an array of individually controllable elements configured to receive radiation output from the second homogenizer stage;
a detector configured to detect a diameter of a radiation beam incident upon the first homogenizer stage; and
a processor configured to determine a peak intensity of the radiation beam in a second microlens array of the second pair of microlens arrays based upon the detected diameter of the radiation beam.

7. A method of homogenizing a radiation beam comprising:
passing the radiation beam through a first pair of microlens arrays;
passing the radiation beam through focusing optics;
passing the radiation beam through a second pair of microlens arrays, wherein the first and second pairs of microlens arrays are two-dimensional microlens arrays;
passing the radiation beam through additional focusing optics;
detecting a diameter of the radiation beam; and
determining a peak intensity of the radiation beam in a second microlens array of the second pair of microlens arrays based upon the detected radiation beam diameter.

8. The method of claim 7, wherein a second microlens array of the first pair of microlens arrays does not lie in a focal plane of a first microlens array of the first pair of microlens arrays.

9. The method of claim 7, wherein each of the focusing optics of the first and second homogenizer stages comprises one or more condensing lenses.

10. The method of claim 7, wherein the method further comprises adjusting the diameter of the radiation beam in response to a determined peak intensity.

11. The method of claim 7, wherein the method further comprises passing the homogenized radiation from the homogenizer to an array of individually controllable elements.

* * * * *